United States Patent [19]
Statnikov et al.

[11] Patent Number: 5,741,405
[45] Date of Patent: Apr. 21, 1998

[54] SPOTTER-DEPOSIT METHOD AND APPARATUS

[75] Inventors: Boris Sh. Statnikov, Nazareth Illit; Victor B. Gutkin, Kibbutz Ein Carmel, both of Israel; Vasily N. Trofimiack, Kiev, Ukraine

[73] Assignee: IPMMS (Development and Production), Migdal Haemek, Israel

[21] Appl. No.: 681,518

[22] Filed: Jul. 23, 1996

[30] Foreign Application Priority Data

Oct. 22, 1995 [IL] Israel ......................... 115713

[51] Int. Cl.⁶ ..................... C23C 14/34; C23C 14/54; C23C 14/56
[52] U.S. Cl. ................. 204/192.14; 204/192.12; 204/192.15; 204/298.08; 204/298.09; 204/298.25; 204/298.26
[58] Field of Search ............. 204/192.12, 298.08, 204/298.09, 298.25, 298.26, 298.28, 192.14, 192.15

[56] References Cited

U.S. PATENT DOCUMENTS

| | | | |
|---|---|---|---|
| 4,508,049 | 4/1985 | Behn et al. | 118/50.1 |
| 4,521,280 | 6/1985 | Bahrle et al. | 29/829 |
| 4,705,592 | 11/1987 | Bahrle et al. | 156/630.1 |
| 4,812,217 | 3/1989 | George et al. | 204/192.12 |
| 4,891,009 | 1/1990 | Pivit et al. | 432/223 |
| 4,902,394 | 2/1990 | Kenmotsu et al. | 204/192.12 |
| 5,284,548 | 2/1994 | Carey et al. | 216/18 |
| 5,300,205 | 4/1994 | Fritsche | 204/192.12 |
| 5,500,102 | 3/1996 | Ichikawa et al. | 204/192.25 |
| 5,510,011 | 4/1996 | Okamura et al. | 204/192.3 |

FOREIGN PATENT DOCUMENTS

| | | | |
|---|---|---|---|
| 227857 | 7/1987 | European Pat. Off. . | |
| 289194 | 11/1988 | European Pat. Off. | 204/192.12 |
| 457339 | 11/1991 | European Pat. Off. . | |
| 2393854 | 1/1979 | France | 204/192.12 |
| 266242 | 3/1989 | German Dem. Rep. | 204/298.08 |
| 54-32490 | 10/1979 | Japan . | |
| 54-32942 | 10/1979 | Japan . | |
| 62-142763 | 6/1987 | Japan | 204/298.08 |
| 2-232366 | 9/1990 | Japan | 204/298.08 |

*Primary Examiner*—Aaron Weisstuch
*Attorney, Agent, or Firm*—Benjamin Barish

[57] ABSTRACT

A method and apparatus for sputter-depositing a layer of a material on a substrate, in which the layer is applied to the substrate by sequentially effecting a plurality of partial sputter-deposits thereon during a plurality of operational periods each including a sputter-deposit time interval followed by a non-deposit time interval of at least equal duration to the sputter-deposit time interval.

32 Claims, 4 Drawing Sheets

SPOTTER-DEPOSIT METHOD AND APPARATUS

FIELD AND BACKGROUND OF THE INVENTION

The present invention relates to a method, and also to apparatus, for sputter-depositing a layer of a material on a substrate. The invention is particularly useful for copper-plating, by a magnetron-enhanced cathode sputtering technique, substrates for printed circuit boards and the like having through-holes, and is therefore described below with respect to this application.

Many methods are known utilizing magnetron-enhanced cathode sputtering techniques for depositing various materials on a substrate, particularly for making printed circuit boards. Examples of known methods and apparatus are described in U.S. Pat. Nos. 4,521,280, 4,705,592 and 4,891,009, and in published European Patent Application No. 88303519.8, Publication No. 0289194-A2, and European Patent Application No. 91107991.1, Publication No. 0457339-A2. However, the known techniques are characterized by a number of drawbacks particularly when used for plating printed circuit boards substrates having through-holes. One serious drawback is that the known techniques are generally characterized by low metal deposition rates, of no more than 10 nm/s, in order to avoid overheating the substrate and deterioration of the quality of the deposited layer; thus, excessive heat produced during the deposition tends to decompose the substrate and to generate gasses and liquid radicals which may disrupt the electroconductivity of the deposited coating. Another drawback is the difficulty in producing printed circuit boards having plated through-holes of small diameter as compared to the substrate thickness, which difficulty increases with the increasing density of circuit patterns on printed circuit boards.

OBJECTS AND BRIEF SUMMARY OF THE INVENTION

An object of the present invention is to provide a sputter-deposition method and also apparatus having advantages in the above respects.

According to one aspect of the present invention, there is provided a method of sputter-depositing a layer of a material on a substrate, characterized in that the layer is applied to the substrate by sequentially effecting a plurality of partial sputter-deposits thereon during a plurality of operational periods each including a sputter-deposit time interval followed by a non-deposit time interval of at least equal duration to the sputter-deposit time interval.

According to further features in the described preferred embodiments, the substrate is cooled during the non-deposit time intervals, and preferably also during the sputter-deposit time intervals.

As will be described more particularly below, the method is especially useful for plating substrates of printed circuit boards having through-holes of small diameter compared to the thickness of the substrate. In such applications, the ratio of the sputter-deposit time intervals to the operational periods is preferably from 1:2 to 1:12, with each of the sputter-deposit time intervals being from one to twenty seconds during which the partial deposits are applied at a rate of 15-70 nm/s. Preferably, the overall layer thickness deposited on the substrate surface ranges from 1 to 15 microns, with the ratio variation of substrate thickness to through-holes diameter from 2:1 to 8:1. A table is set forth below listing examples of the foregoing parameters with respect to different materials having different ratios of thickness to hole diameter. Such a method is thus capable of plating thin layers at a relatively high rate with less danger of overheating, and is particularly useful for plating substrates of printed circuit boards having through-holes of relatively small diameter as compared to the substrate thickness.

The invention also provides apparatus for sputter-depositing a layer of a material on substates in accordance with the method of the present invention.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
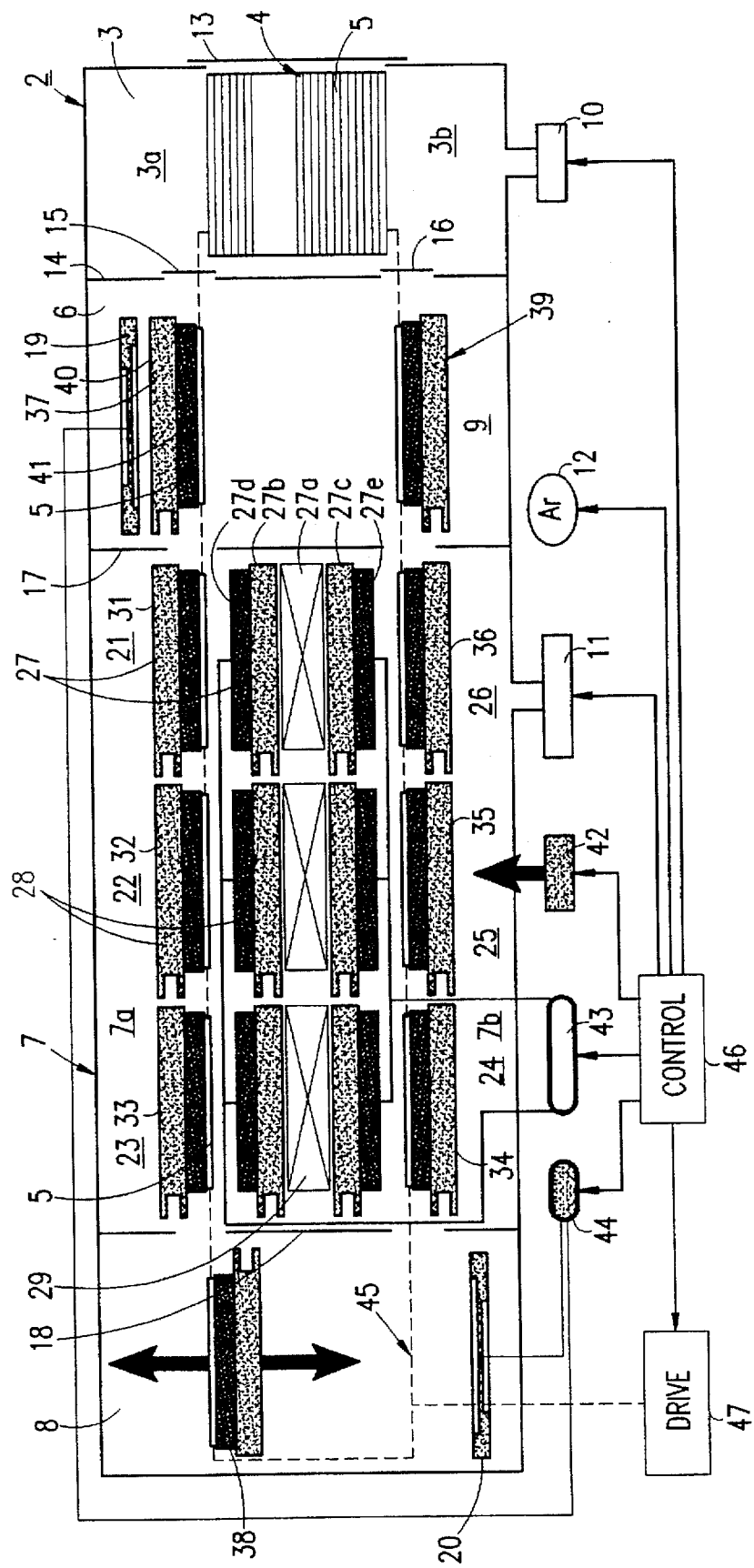
FIG. 1 illustrates a linear-type apparatus constructed in accordance with the present invention.

The apparatus illustrated in FIG. 1 is adapted for plating printed circuit boards substrates or other substrates with copper layers on both sides and in through-holes having small diameters compared to the thickness of the substrate. The copper plating is effected by a magnetron-enhanced cathode sputtering technique, such as described in the above-cited patent publications.

The apparatus illustrated in FIG. 1 includes an evacuated chamber 2, having a controlled gaseous atmosphere, e.g., of argon. Evacuated chamber 2 includes an airlock compartment 3 having an entrance section 3a receiving cassette 4 for the substrates 5 to be plated, and an exit section 3b for removing the substrates after they have been plated. The substrates 5 are conveyed first through a surface activation compartment 6, then through section 7a of a plating compartment 7 wherein one face of the substrates is plated sequentially in the form of a series of partial deposits. The substrates are then conveyed through a turnaround compartment 8 where the substrates are inverted to expose their opposite faces for plating before they are conveyed through section 7b of the plating compartment 7 where their opposite faces are plated. They are then conveyed through a cooling compartment 9 to the exit airlock section 3b for removal from the evacuated chamber 2. Chamber 2 is maintained evacuated by a vacuum pump 10 in the airlock compartment 3, and also by a vacuum pump 11 in the plating compartment 7. The gaseous atmosphere is provided by a supply of argon 12.

Evacuated chamber 2 includes a door 13 leading into the airlock compartment 3 for loading and unloading the cassette 4 containing the substrates 5 to be plated. The airlock compartment 3 is separated from the surface activation compartment 6 and the cooling compartment 9 by partition 14 having openings closed by vacuum valves 15, 16. The two sides of the plating compartment 7 are separated from compartments 6 and 9 on one side by partition 17, and from turnaround compartment 8 on the opposite side by partition 18.

The surface activation compartment 6 at the entrance end of the plating compartment 7 includes a surface activation unit 19 of known construction. Unit 19 may be of a magnetron sputtering-type to clean the substrate surfaces before the substrates enter section 7a of the plating compartment 7 for plating one side of the substrates. A similar surface activation device 20 is provided in the turnaround compartment 8 for similarly sputter-cleaning the opposite side of the substrates before they enter section 7b of the plating compartment 7.

In the example illustrated in FIG. 1, the plating compartment 7 includes a line of three plating stations 21, 22, 23 in its section 7a for plating one face of the substrates, and a similar line of three plating stations 24, 25, 26, in section 7b for plating the opposite face of the substrates. Plating compartment 7 further includes three magnetron-sputtering devices 27, 28, 29. Each of the latter devices is a double-sided device; that is, each is effective on one side to plate one face of the substrates as they pass through plating stations 21–23, and on the opposite side to plate the opposite face of the substrates as they pass through plating stations 24–26.

Thus, as shown with respect to magnetron sputtering device 27, it includes a magnet 27a and water-cooled cathode plates 27b, 27c on its opposite sides, with each cathode plate carrying a target plate 27d, 27e of the material (e.g., copper) to be sputter-deposited on the substrates. Since the structure and mode of operation of such magnetron-enhanced cathode sputtering devices are well known, further details are not set forth herein.

Each of the plating stations 21–26 in the plating compartment 7 includes a cooling or heat-sink unit 31–36. Further cooling or heat-sink units 37, 38 and 39 are included, respectively, in the surface activation compartment 6 upstream of the first plating station 21, in the turnaround compartment 8, and in the cooling compartment 9 at the exit end of the plating compartment 7. The illustrated apparatus thus includes nine cooling or heat-sink units 31–39.

As shown by unit 37, each cooling or heat-sink unit 31–39 includes a water-cooled panel 40 and a resilient thermally-conductive pad or mattress 41 interposed between panel 40 and the substrate 5. As will be described more particularly below, the resilient thermally-conductive pad 41 is especially constructed so as to efficiently and uniformly cool the substrate 5 which is clamped to it. Examples of such constructions are described below with respect to FIGS. 4–9.

The water-cooling or heat-sink units 31–39 are cooled by a water cooling system 42. The cathodes of magnetron sputtering devices 27–29 are energized by a common power supply 43. Another power supply 44 is provided for energizing the surface activation devices 19 and 20.

The substrates are conveyed from station to station through the evacuating chamber 2 in any suitable manner, shown schematically by conveyor belt 45. Each station is equipped with one of the cooling units 31–39, and when a substrate is in a station it is clamped to the respective cooling unit by any suitable clamping means (not shown) so as to be pressed firmly in contact, as will be described more particularly below, with the resilient thermally-conductive pad 41 of the cooling unit. The overall control of the apparatus is schematically illustrated by box 46. It controls the conveyor drive, schematically illustrated by box 47, the water cooling system 42, the power supply 43 for the sputtering devices 27–29, the power supply 44 for the surface activation devices 19 and 20, vacuum pumps 10, 11 and gas supply 12.

As briefly described earlier, the material to be deposited from the targets of the sputtering devices 27–29 is applied to each face of the substrates 5 by sequentially effecting a plurality of partial deposits as a result of a plurality of partial sputters during a plurality of operational periods each including a sputter-deposit time interval followed by a non-deposit time interval of at least equal duration to the sputter-deposit time interval. Preferably, the ratio of the sputter-deposit time intervals to the operational period is from 1:2 to 1:12, with each of the sputter-deposit time intervals being from one to twenty seconds.

Preferably, the plating Chamber 7 includes three sputtering devices 27–29 with six cathodes, which number defines the sputter-deposit time interval fraction of the overall operational period to enable the cathodes to be sequentially energized from the same power supply 43, operating continuously. Since the example illustrated in FIG. 1 shows three such sputtering devices 27–29 with six cathodes, it will be assumed for the operation described below that each operational period will involve a sputter-deposit time interval or one-sixth of an operational period during which the sputtering device for one substrate is energized, and five non-deposit time intervals. For example, if an operational period is thirty seconds, each sputter-deposit time period would be five seconds, and each non-deposit time period would be twenty-five seconds, whereupon the foregoing ratio would be 1:6.

The substrates 5, e.g., of printed circuit board of 18"×24" having through-holes, are loaded in cassette 4 in the airlock compartment 3 and are conveyed by conveyor 45 sequentially through the following path: surface activation compartment 6; sputter-deposit stations 21, 22, 23 in the section 7a of the plating compartment 7; the turnaround compartment 8; sputter-deposit stations 24, 25, 26 in the section 7b of the plating compartment 7; cooling compartment 9; and into the exit section 3b of the airlock compartment 3 for unloading via door 13. In each of these locations, the substrate is firmly clamped to a cooling or heat-sink unit 31–39 in the respective compartment or section such that it is firmly pressed against the resilient thermally-conductive pad 41 in contact with the respective water cooled panel 40 such that the latter panel efficiently and uniformly cools the substrate.

The time of a substrate stay at each cooling unit 31–39 amounts to one-sixth of the complete operational period for layer deposition of the required thickness. For example, in item No. 5 of the table below, the complete operational period for a substrate surface layer of 2 microns deposition is 360 seconds, and therefore the substrate stay at each cooling unit 31–39 will be for sixty seconds. At each cooling unit 31–36, there will be two sputter-deposit time intervals with a duration of five seconds each, and two non-deposit time intervals with a duration of twenty-five seconds each. The surface activation time at each position 37 and 38 is thirty seconds.

The following operations are thus performed on each substrate 5: when received in the surface activation compartment 6 in contact with the cooling unit 37 therein, it is first subjected to a sputter-cleaning action by the surface activation device 19 for a period of thirty seconds, later for a period of 30 seconds it is subjected to a sputter-cleaning action by the surface activation device 20 at the position 38. Power supply 44 energizes surface activation devices 19, 20 in turn. From the cooling unit 37, the substrate is then advanced by the conveyor 45 into contact with cooling unit 31 in the first sputter-deposit station 21 of the plating compartment 7 where it remains, clamped to the cooling unit for sixty seconds. During this period of time, cathode 27b of the sputtering device 27 in station 21 is energized to effect two partial depositions of five seconds duration each, with two non-deposit intervals with twenty-five seconds duration each. During each non-deposit interval at station 21, power supply 43 is energized for five seconds sequentially to each of the remaining five cathodes in sputtering devices 27–29.

At the beginning of the next sixty-second time period, the conveyor 45 is advanced one position to bring the substrate in the first station 21 into the second station 22 where it is firmly clamped to the cooling unit 32 in that station. While in station 22, the substrate 5 is again subjected to two sputter-deposit intervals of five seconds each, and two non-deposit time intervals of twenty-five seconds each, during which the substrate is permitted to cool before the next sputter-deposit is applied.

When the substrate reaches the turnaround compartment 8, it is inverted and is then sequentially passed through sputter-deposit stations 24, 25, and 26. In each station, the substrate is firmly clamped to the cooling unit 34–36 in the respective station as the opposite cathodes of the sputtering devices. 27–29 effect partial deposits of the plating material on the opposite face of the substrate for two five second intervals each of two thirty-second periods, permitting the substrate to cool for the remaining twenty-five seconds of the respective period. The substrate moves from the last plating station 26 into cooling compartment 9 for a further sixty seconds cooling before being fed to the exit section 3b of the airlock compartment 3 for removal from the apparatus.

Thus, every sixty seconds a substrate 5 is passed from cassette 4 of compartment 3a and is conveyed from station to station along conveyor path 45 until it exits into the same cassette 4 through compartment 3b.

Figure 3:
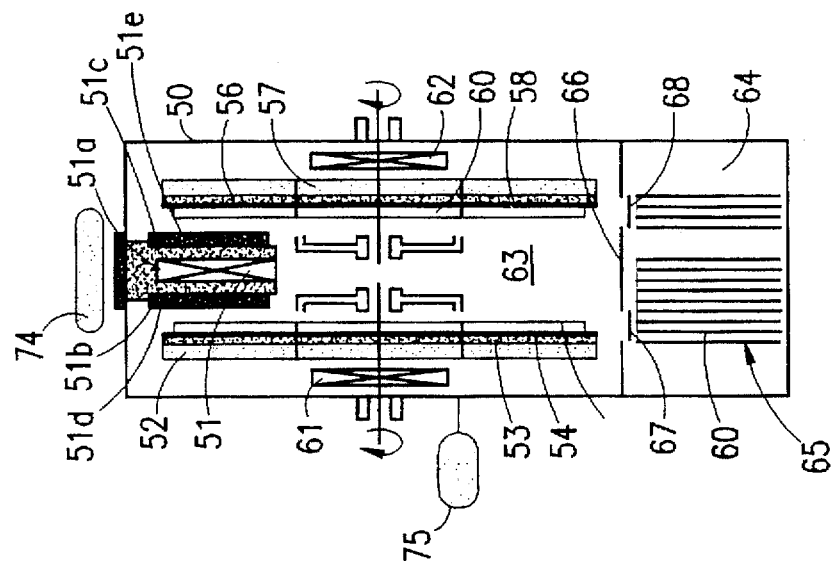
FIG. 3 is a sectional view along line III—III of FIG. 2.
Figure 2:
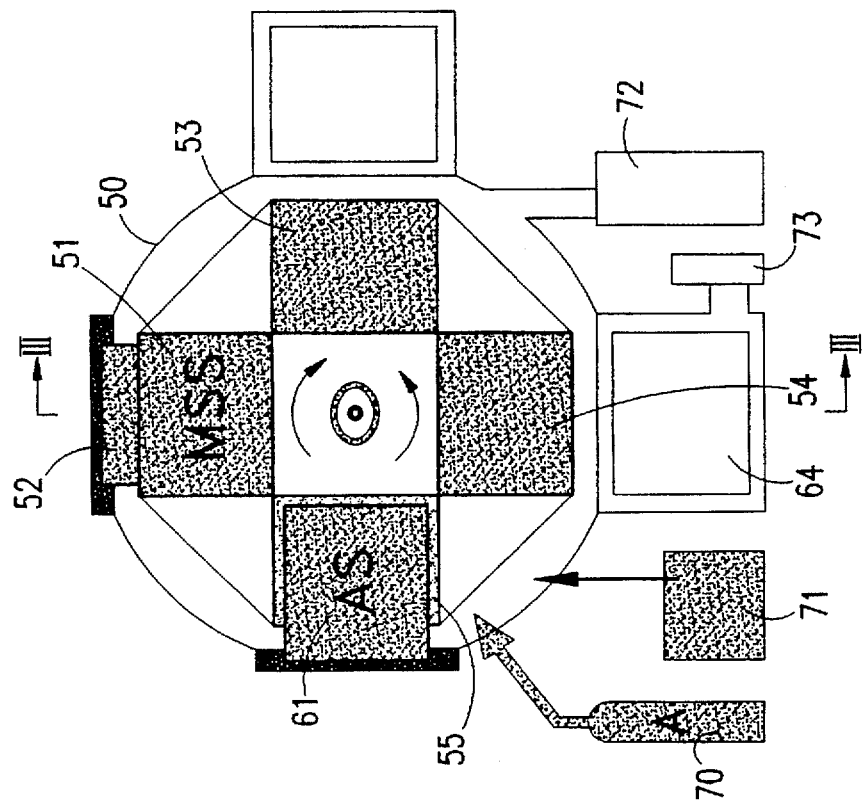
FIG. 2 illustrates a carousel-type apparatus constructed in accordance with the present invention.

FIGS. 2 and 3 illustrate a carousel-type apparatus including a cylindrical evacuation chamber 50 rotatably mounted with respect to a fixed magnetron sputtering device 51 of a double-sided construction similar to each of the devices 27–29 in FIG. 1. Thus, as shown particularly in FIG. 3, magnetron sputtering device 51 includes a magnet 51a; a cathode 51b, 51c on its opposite faces; and a target 51d, 51e of the material to be deposited, on the outer faces of the two cathodes.

In this case, there are two groups of cooling or heat-sink units on opposite sides of the magnetron sputtering device 51; each group includes four cooling units arranged in a circular array. Thus, on one side (the left side, FIG. 3) of the magnetron sputtering device 51 there are four cooling or heat-sink units 52–55 arranged in a circular array; and on the opposite side, there are four further cooling or heat-sink units 56–59 also arranged in a circular array. Unit 52 of one group and unit 56 of the other group are axially aligned with the magnetron sputtering device 51 and define a sputter-deposit station on each side of device 51. Each of the cooling or heat-sink units 52–59 is similarly constructed as units 31–39 in FIG. 1; each includes a water-cooled panel and a resilient thermally-conducting pad to which the substrate is clamped for efficiently and uniformly cooling the substrate.

The substrates 60 are conveyed first across the circular array of cooling units 52–55 and then in the opposite direction across the other circular array of cooling units 56–59. The substrate 60 clamped to cooling unit 52 in alignment with sputtering device 51, receives a sputter-deposit of the plating material (copper) on one face from the respective side of the sputtering device; and the substrate clamped to cooling unit 56 aligned with the other side of sputtering device 51 receives a sputter-deposit of the plating material from that side of device 51.

The apparatus illustrated in FIGS. 2 and 3 further includes a surface activation device 61 aligned with the cooling unit 55 immediately ahead of the unit 52 aligned with the magnetron sputtering device 51 in order to sputter-clean the respective face of the substrate before it comes into alignment with the magnetron sputtering device. The illustrated apparatus includes a second surface activation device 62 on the opposite side of evacuation chamber 50 for similarly sputter-cleaning the opposite face of each substrate just before it is conveyed into alignment with the magnetron sputtering device 51.

All the foregoing elements are located in the plating compartment 63 of the evacuated chamber 50. Evacuated chamber 50 further includes an airlock compartment 64 for receiving the cassette 65 holding the substrates 60. The airlock compartment 64 is defined by a partition 66 having an entrance opening closed by a vacuum valve 67 and an exit opening closed by a vacuum valve 68.

FIG. 2 schematically illustrates the gas supply (e.g., argon) 70 for the evacuated chamber 50, the water cooling system 71 for the cooling units 52–59, and the two vacuum pumps 72, 73; whereas FIG. 3 schematically illustrates the power supply 74 for the magnetron sputtering device 51, and also the power supply 75 for the surface activation units 61, 62.

The apparatus illustrated in FIGS. 2 and 3 also operates, as described above with respect to the apparatus illustrated in FIG. 1, to apply a plurality of partial deposits on each face of the substrates during a plurality of operational periods each including a sputter-deposit time interval followed by a non-deposit time interval of at least equal duration as the sputter-deposit time interval.

However, whereas in the FIG. 1 apparatus the complete layer to be sputter-deposited is applied in a single pass of the substrates through a plurality of stations each occupied by a magnetron sputtering device (27–29), in the apparatus illustrated in FIGS. 2 and 3 there is sputtering device 51 with two cathodes, defining two sputter-deposit stations, each for one side of the substrate to be plated Accordingly, in the apparatus of FIGS. 2 and 3, it is necessary to convey each substrate through the sputter-deposit station a plurality of times according to the number of deposits to be applied. Also, a complete operational period would be defined by one complete rotation of the substrates so that each substrate would be aligned with the sputtering device 51 during the sputter-deposit time interval of the respective operational period, and with the cooling units not aligned with the sputtering device during the non-deposit time interval of the respective operation period.

For example, in the construction illustrated in FIGS. 2 and 3 utilizing four cooling units on each side, each substrate could be conveyed in four passes through each of the two groups of cooling units, moving in opposite directions and in steps of equal time intervals, while two cathodes 51b, 51c of the magnetron sputtering device 51 are energized in turn, and the power supply 74 is continuously operating. Thus, each face of the substrate will receive a sputter deposit during one-eighth the time of each operational period (i.e., one rotational cycle), while it is merely cooled during the non-deposit intervals of the remaining seven-eighths of each rotational cycle.

It will be appreciated that in both of the above-described constructions, an excessive build-up in heat is prevented in the substrates since they are always firmly held against a cooling or heat-sink unit at all times except during their movements between stations. It will also be appreciated that, when the substrates are held against a cooling or heat-sink unit, good heat exchange is effected by the resilient thermally-conductive pads interposed between the substrates and their cooling panels. The substrate may advantageously be cooled by a cooling panel with a heat sink of at least $0.25 \times 10^4$ W/m².

Figure 5:
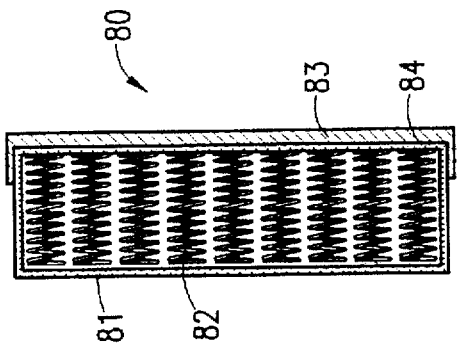
FIGS. 5 and 6 are sectional views along lines V—V and VI—VI, respectively, of FIG. 4.
Figure 4:
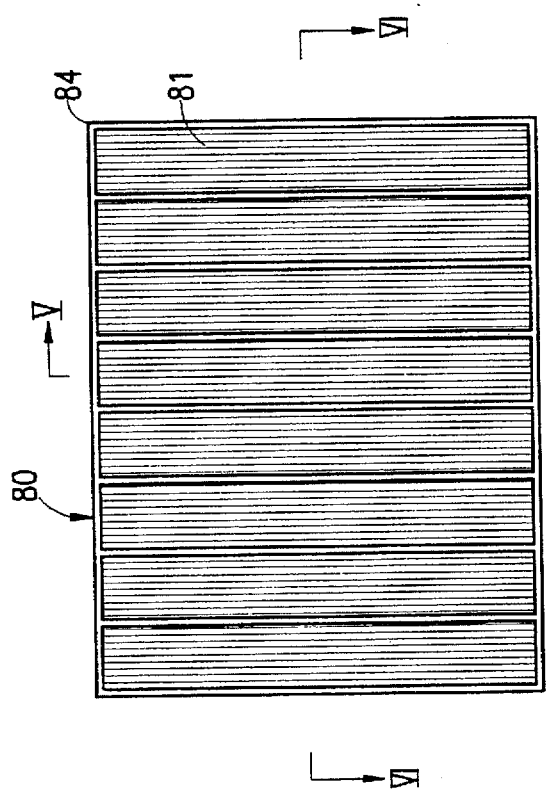
FIG. 4 is a plan view of one form of resilient thermally-conductive pad that may be used in each cooling or heat-sink unit in the apparatus of FIGS. 1–3.
Figure 6:
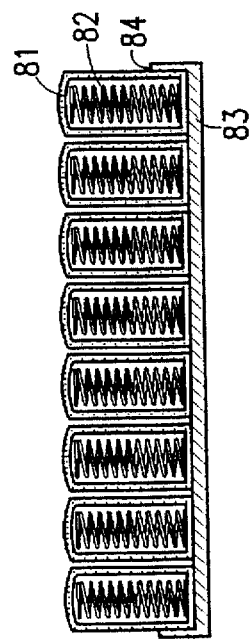
Figure 7:
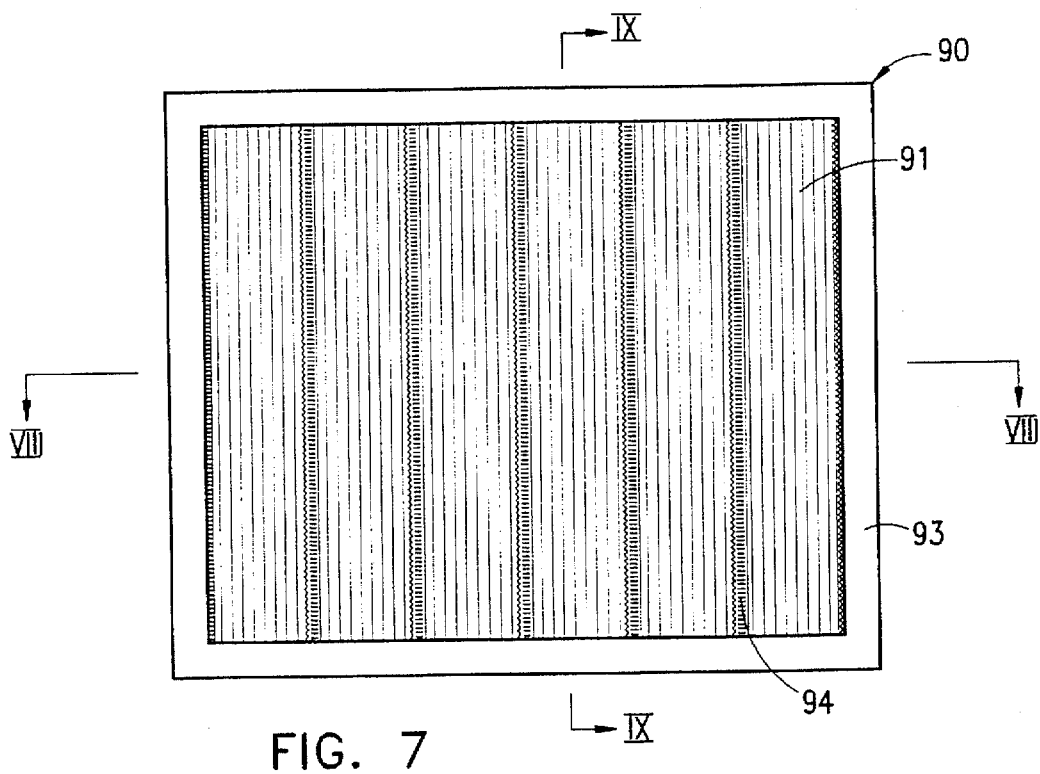
FIG. 7 is a plan view illustrating another form of resilient thermally-conductive pad which may be used.
Figure 8:
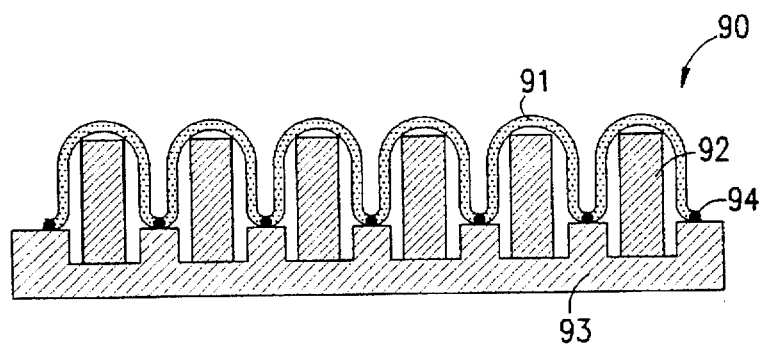
FIGS. 8 and 9 are sectional views along lines VIII—VIII and IX—IX, respectively, of FIG. 7.
Figure 9:
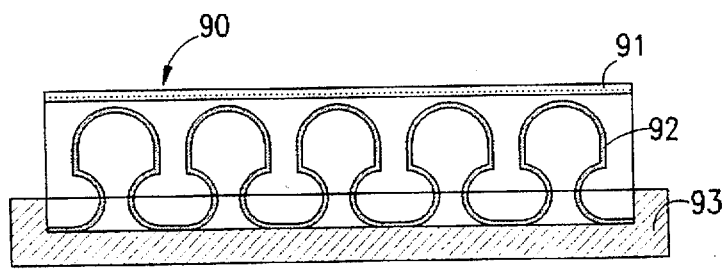

FIGS. 4–6 and 7–9 illustrate two constructions of such resilient thermally-conductive pads which may be used for this purpose. The resilient thermally-conductive pad illustrated in FIGS. 4–6 is generally designated 80. It includes a plurality of sleeves 81 of woven copper in side-by-side relation and each enclosing a line of coil springs 82 mounted on a copper water-cooled panel 83 on the plane 84. FIGS. 7–9 illustrate such a thermally-conductive pad, generally designated 90, constituted of a plurality of woven sheets 91 of woven copper also arranged in side-by-side relation and each enclosing a metal ribbon spring 92, the sheets being soldered to a copper water-cooled panel 93 along solder lines 94.

It will thus be seen that in both of the foregoing constructions, the substrates, when clamped to the respective thermally-conductive pads, will deform under the influence of thermal stresses during the metal deposition but will be even when the respective substrate deforms because of thermal stresses. The springs may also be of other types.

The inner size of sleeves 81, or the distance between solder lines 94 in the holder plane, is 5–12 mm; and the size of the enclosed springs is 0.7–0.9 of the inner size of the sleeve or the distance between solder lines 94 in the plane of the holder, and 1.0–2.0 of this size in the plane perpendicular to the holder plane. The substrate is clamped to the resilient, thermally-conductive pad, with the spring force providing compression from 20 to 70% of their size in the perpendicular to the holder plane direction.

If the size of the sleeve 81, or the distance between solder lines 94, is less than 5 mm, the necessary contact force may not be provided over all the surface of a substrate of a given size; and if this size is more than 12 mm, a heat transfer cross-section may not be sufficient for providing the desirable heat sink.

The above-described technique enables metalization of various types of dielectric substrates formed with through-holes of small diameter providing different ratios of hole-diameter to substrate (e.g., PCB) thickness. Generally, the duty cycle (i.e., ratio of sputter-deposit interval to the complete operational period), will be selected from 1:2 to 1:12, depending on the dielectric material, length of the sputter-deposit interval (sputtering-deposition impulse duration), deposition rate and coating thickness. Following is a table setting forth preferred values for the above parameters for various dielectric substrates used in printed circuit boards (PCBs).

TABLE

| N | Dielectric base of PCB | Critical temperature °C. | Minimal diameter of hole mm | Ratio of PCB thickness to hole diameter | Duty cycle | Sputtering-deposition impulse duration s | Deposition rate on surface nm/s | Copper coating thickness μm | Complete operational period minutes | Substrate feed cycle from cassette minutes |
|---|---|---|---|---|---|---|---|---|---|---|
| 1 | PTFE-Laminate | 260 | 0.25 | 8 | ½ | 1 | 50 | 15 | 10 | 5 |
| 2 | KAPTON polyimide | 200 | 0.4 | 6 | ¼ | 15 | 48 | 10 | 14 | 3.5 |
| 3 | KAPTON polyimide | 200 | 0.4 | 4 | ⅙ | 20 | 70 | 5 | 7.2 | 1.2 |
| 4 | Epoxy-glass Laminate G-11 | 155 | 0.4 | 4 | ⅙ | 5 | 42 | 5 | 12 | 2.0 |
| 5 | Epoxy-glass Laminate FR-4 | 120 | 0.5 | 3.2 | ⅙ | 5 | 34 | 2 | 6.0 | 1.0 |
| 6 | Epoxy-glass Laminate FR-4 | 120 | 0.5 | 3.2 | ⅛ | 10 | 33 | 2 | 8.0 | 1.0 |
| 7 | Epoxy Paper FR-3 | 90 | 0.6 | 2.7 | ⅙ | 2 | 15.6 | 1.5 | 9.6 | 1.6 |
| 8 | Epoxy paper FR-3 | 90 | 0.3 | 5.3 | 1/12 | 10 | 20 | 12 | 120 | 10 | efficiently and uniformly contacted by the pads so as to produce good heat transfer between the substrates and the water cooled panel through the respective pad. Thus, the coil springs 82 in the embodiment of FIGS. 4–6, and the ribbon springs 92 in the embodiment of FIGS. 7–9, provide several degrees of freedom to assure good contact at every point of the surface of the substrate with respect to the cooling unit While the invention has been described with respect to several preferred embodiments, it will be appreciated that these are set forth merely for purposes of example, and that many other variations, modifications and applications of the invention may be made.

We claim:

1. A method of sputter-depositing a layer of a metallic material on a printed circuit board substrate in a vacuum, characterized in that the layer is applied to the substrate by sequentially effecting a plurality of partial sputter-deposits thereon during plurality of operational periods each including a sputter-deposit time interval followed by a non-deposit time interval of at least equal duration to the sputter-deposit time interval.

2. The method according to claim 1, wherein said substrate is cooled during said non-deposit time intervals.

3. The method according to claim 2, wherein said substrate is also cooled during said sputter-deposit time intervals.

4. The method according to claim 2, wherein the ratio of said sputter-deposit time intervals to the respective operational period is from 1:2 to 1:12.

5. The method according to claim 2, wherein the substrate is cooled by a cooling panel with heat sink of at least 0.25 $10^4$ W/m$^2$.

6. The method according to claim 1, wherein said partial deposits are effected by a cathode sputtering device in an evacuated chamber having a controlled low pressure gaseous environment by applying a high cathode voltage to a cathode carrying a target of the material to be sputter-deposited.

7. The method according to claim 6, wherein said cathode sputtering device is a magnetron-enhanced cathode sputtering device.

8. The method according to claim 6, wherein the substrate is fed through a plurality of sputter-deposit stations each effecting a partial deposit on the substrate.

9. The method according to claim 8, wherein said sputter-deposit stations are arranged in at least one linear path.

10. The method according to claim 9, wherein there is a cathode sputtering device at each station, and a plurality of substrates are fed in a plurality of linear passes through said plurality of stations in one linear path.

11. The method according to claim 10, wherein each substrate is located in a sputter-deposit station for a plurality of operational periods, and said cathode sputtering devices are sequentially energized by a common power supply.

12. The method according to claim 11, wherein said sputter-deposit stations are arranged in two linear paths, one for making sputter deposits on one face of a substrate and the other for making sputter deposits on the opposite face of the substrate.

13. The method according to claim 8, wherein there is a cooling unit at each of said sputter-deposit stations.

14. The method according to claim 13, wherein each of said cooling units includes a cooling panel and a resilient thermally-conductive pad interposed between the substrate and the cooling panel for evenly supporting and uniformly cooling the substrate.

15. The method according to claim 14, wherein each of said resilient thermally-conductive pads includes an outer flexible metal layer enclosing metal springs.

16. The method according to claim 6, wherein there is at least one sputter-deposit station for each substrate face, and said substrate is fed in a plurality of passes through said at least one sputter-deposit station.

17. The method according to claim 16, wherein a plurality of substrates are sequentially fed in a plurality of rotary passes through said sputter-deposit station.

18. The method according to claim 17, wherein said plurality of substrates are fed through two circular paths on sides opposite to said cathode sputtering devices and are moved along said paths in opposite directions.

19. The method according to claim 1, wherein said printed circuit board substrate is a dielectric and is formed with through-holes which are plated by said sputter-deposited metallic material, said sputter-deposited metallic material being copper.

20. Apparatus for sputter-depositing a layer of a metallic material on printed circuit board substrates, comprising:

an evacuated chamber having a controlled gaseous environment;

holders for holding said substrates;

cathode sputtering devices carrying targets of the material to be sputtered onto the substrates;

and a control system for controlling the cathode sputtering devices to apply the layer on the substrates in the form of a plurality of partial sputter-deposits during a plurality of operational periods each including a sputter-deposit time interval followed by a non-deposit time interval of at least equal duration to the sputter-deposit time interval.

21. The apparatus according to claim 20, further including cooling means for cooling said substrates during both said non-deposit time intervals and said sputter-deposit time intervals.

22. The apparatus according to claim 21, wherein said control system sets up a ratio of said sputter-deposit time intervals to said operational periods of from 1:2 to 1:12.

23. The apparatus according to claim 20, wherein said cathode sputtering device is a magnetron-enhanced cathode sputtering device.

24. The apparatus according to claim 20, wherein said evacuated chamber includes an entrance airlock section at the entrance end of the evacuated chamber, an exit airlock section at the exit end of the evacuated chamber, a surface activation device in said entrance airlock section and a cooling device in said exit airlock section.

25. The apparatus according to claim 24, wherein said evacuated chamber includes a plurality of sputter-deposit stations arranged in at least one linear path, there being a cathode sputtering device at each of said stations, and said holders include a clamp device and a conveyor for conveying a plurality of substrates sequentially to said stations.

26. The apparatus according to claim 25, wherein there is a common power supply for energizing all said cathode sputtering devices sequentially.

27. The apparatus according to claim 25, wherein said sputter-deposit stations are arranged in two linear paths, one for applying sputter deposits on one face of the substrate, and the other for applying sputter deposits on the opposite face of the substrate.

28. The apparatus according to claim 25, wherein there is a cooling unit at each of said sputter-deposit stations.

29. The apparatus according to claim 25, wherein there is at least one sputter-deposit station for each substrate face, and said holders include a clamp device and a conveyor for conveying said substrate in a plurality of rotary passes through a rotary path including said sputter-deposit station.

30. The apparatus according to claim 29, wherein said conveyor conveys a plurality of said substrates through two circular paths on sides opposite to said cathode sputtering devices and are moved along said paths in opposite directions.

31. The apparatus according to claim 29, wherein there is a cooling unit at said sputter-deposit station, and a plurality of further cooling units on said rotary path.

32. The apparatus according to claim 31, wherein each of said cooling units includes a cooling panel and a resilient thermally-conductive pad interposed between the substrate and the cooling panel for evenly supporting and uniformly cooling the substrate.

* * * * *